United States Patent [19]

King et al.

[11] Patent Number: 4,595,608
[45] Date of Patent: Jun. 17, 1986

[54] METHOD FOR SELECTIVE DEPOSITION OF TUNGSTEN ON SILICON

[75] Inventors: Edward M. King, Melbourne Beach; Kurt E. Gsteiger, Indialantic; Joseph S. Raby, W. Melbourne, all of Fla.

[73] Assignee: Harris Corporation, Melbourne, Fla.

[21] Appl. No.: 669,787

[22] Filed: Nov. 9, 1984

[51] Int. Cl.⁴ .................... B05D 7/22; C23C 16/08
[52] U.S. Cl. .................... 427/237; 427/248.1; 427/250; 427/253; 427/255; 427/255.2; 427/259; 427/299; 427/309
[58] Field of Search .......... 427/91, 237, 250, 252, 427/253, 255, 248.1, 299, 309, 315, 259, 255.2

[56] References Cited

U.S. PATENT DOCUMENTS

| | | | |
|---|---|---|---|
| 3,477,872 | 11/1969 | Amick | 427/253 |
| 3,565,676 | 2/1971 | Holzl | 427/253 |
| 4,349,408 | 9/1982 | Tarng et al. | 427/253 |
| 4,404,235 | 9/1983 | Tarng et al. | 427/253 |

FOREIGN PATENT DOCUMENTS

| | | | |
|---|---|---|---|
| 52-38428 | 3/1977 | Japan | 427/282 |
| 570658 | 9/1977 | U.S.S.R. | 427/253 |

OTHER PUBLICATIONS

"A Planar Metallization Process—Its Application to Tri-Level Aluminum Interconnection"; T. Moriya et al.; IEEE; 1983; pp. 550–553.

*Primary Examiner*—Sadie L. Childs
*Attorney, Agent, or Firm*—Barnes & Thornburg

[57] ABSTRACT

A metal is selectively chemically vapor deposited on a substrate through openings in a moisture adsorbing mask layer by maintaining moisture in the mask layer. Thick metal layers are formed by precharging the mask with moisture. Also a cleaned tube is prepared for selective deposition by operating the process with a bare substrate until the tube is coated. The selective deposition is then performed.

31 Claims, 4 Drawing Figures

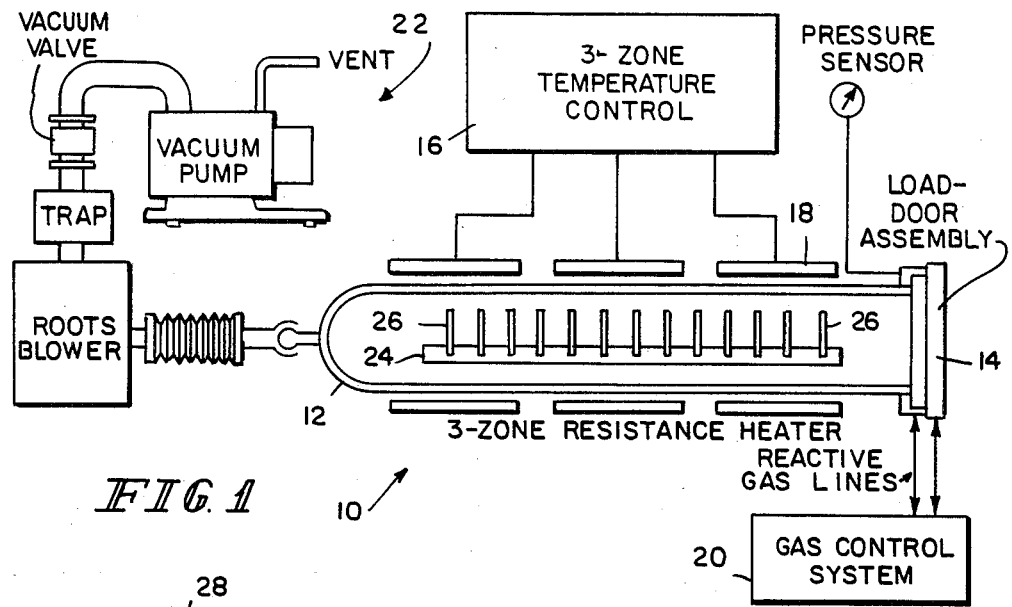
FIG. 1
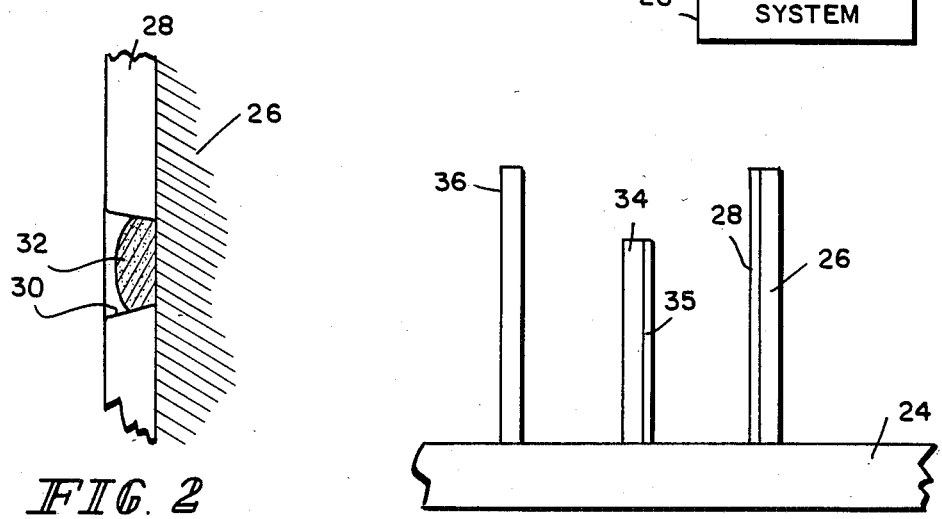
FIG. 2
FIG. 3
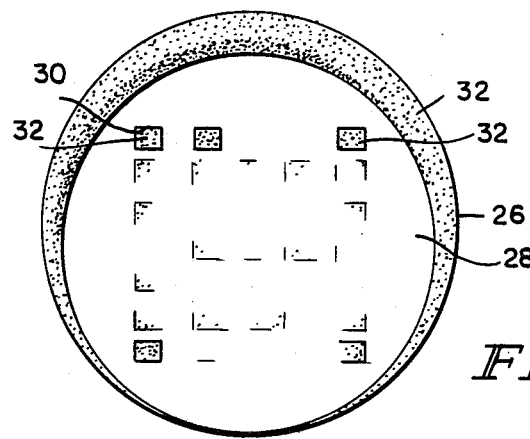
FIG. 4

METHOD FOR SELECTIVE DEPOSITION OF TUNGSTEN ON SILICON

BACKGROUND AND SUMMARY OF THE INVENTION

The present invention relates generally to the selective deposition of metal layers and more specifically to the selective deposition of refractory metals on semiconductor substrates.

The ability to selectively deposit tungsten on silicon exposed through openings in silicon dioxide as well as other glass surfaces is well known. The use of gases for example, tungsten hexafluoride to react with the exposed silicon to begin the deposition of tungsten on silicon is well known. Since the tungsten hexafluoride does not react with the silicon dioxide, there is no deposition on the silicon dioxide. The general temperatures range is from 500°–800° C. It is well known that this system will result only in a limited thickness of tungsten which can be formed on the silicon. In order to increase the thickness as well as to provide a tungsten layer on silicon dioxide, it has been suggested to introduce hydrogen with the tungsten hexafluoride. The hydrogen reacts with the tungsten hexafluoride and causes deposition onto the already formed tungsten as well as onto the silicon dioxide.

Patents which describe these methods of chemical vapor deposition are Amick, U.S. Pat. No. 3,477,872 and Tarng et al., U.S. Pat. Nos. 4,349,408 and 4,404,235. Also, an article entitled "A Planar Metallization Process - Its Application to Tri-level Aluminum Interconnects" by Moriya et al., pages 550–552 IEDM 83, IEEE also describes the selective chemical vapor deposition of tungsten from tungsten hexafluoride.

Although the prior art discusses the ability to selectively deposit tungsten on a silicon-silicon dioxide wafer, these techniques have not been used in production. As indicated in the Moriya et al. paper, after a given amount of time the selectivity disappears. The theory of operation suggested in this paper is that nucleation sites appear later in the CVD process and that with possible appropriate pretreatment these nucleation sites can be minimized.

Another problem in the prior art is the inability without substantial preprocessing of even beginning the chemical vapor deposition of metals, for example, tungsten, in a cleaned tube. The prior art generally bakes and pumps a cleaned tube at 800° C. for one to two hours to generally remove between 90 and 95% of the humidity in the tube. This long drying period has not guaranteed that the tungsten or other metals will begin depositing from the chemical vapors.

Thus, it is an object of the present invention to provide a method to selectively deposit metals in a chemical vapor deposition process with a greater degree of assurance.

Another object of the present invention is to provide a process which is capable of producing a substantially unlimited thickness of metal selectively onto a substrate by chemical vapor deposition.

Still another object of the present invention is to provide a method for assuring the chemical vapor deposition of metal in a cleaned furnace.

These and other objects of the invention are attained by covering a substrate with a moisture adsorbing mask, introducing moisture onto the moisture adsorbing mask and performing a chemical vapor deposition of a gas of the metal to be deposited selectively in openings in the moisture adsorbing mask selectively as long as the moisture is present in the moisture adsorbing mask. For thicker layers of deposited metal, the process is terminated before the moisture is depleted from the moisture adsorbing mask and additional moisture is provided to be adsorbed by the moisture adsorbing mask and the chemical vapor deposition process is reinitiated. The gas flow having the gaseous metal includes a reduction gas and the flow rate is sufficient to minimize the etching from the reduced product. The process is carried out in a low pressure chemical deposition furnace at a low temperature range between 250–400° C. The moisture may be added to the moisture adsorbing mask by introducing a moisture laden atmosphere and then removing it so as to remove all moisture not adsorbed by the moisture adsorbing mask from the atmosphere. Alternatively, a moisture adsorbing material may be placed adjacent to the moisture adsorbing surface to provide a deposition inhibiting barrier at moisture adsorbing surfaces. In a preferred embodiment, the substrate is silicon and the moisture adsorbing mask is a silicon compound or glass. Preferably, the metal is a tungsten or other refractory metal in a gaseous form for example, tungsten hexafluoride, and the reducing gas is hydrogen.

In order to prepare a washed tube for selective vapor deposition, a bare substrate of the material to which selective deposition is to be made, for example, silicon, is placed in the tube and the tube is heated. Gas flow of the material to be deposited is introduced into the heated tube and reacts with the substrate to form a coating on the interior of the tube. The gas flow is terminated and the substrate is removed. The substrate on which selective deposition is to be performed is introduced and the selective vapor deposition process is initiated.

Other objects, advantages and novel features of the present invention will become apparent from the following detailed description of the invention when considered in conjunction with the accompanying drawings.

BRIEF DESCRIPTION OF THE DRAWINGS

FIG. 1 is a schematic of a deposition furnace in which the present invention is practiced.

FIG. 2 is a cross-section of a substrate produced by the process of the present invention.

FIG. 3 is a side view of a boat illustrating the principles of operation of the present invention.

FIG. 4 is a plan view of a substrate produced by the process in FIG. 3.

DETAILED DESCRIPTION OF THE DRAWINGS

The prior art recognizes that refractory metals can be chemically vapor deposited directly on bare silicon and that the introduction of a reducing agent will allow the deposition on previously deposited metals while no metal is deposited on silicon compounds for example, silicon dioxide. They have also observed that after the passage of time, the selectivity disappears and the refractory metal is chemically vapor deposited even on the silicon compounds without recognizing the reason. Through much experimentation, it has been discovered that the source of the selectivity is moisture on the silicon compounds. As long as the moisture is present, the selectivity between the silicon and silicon compounds as well as between the silicon compounds and previously deposited metals is maintained. The presence of moisture in cleaned tubes also prevents the initial chemical vapor deposition. The exact chemical mechanism which is operating is not known, but it is believed that it is the chemical disassociation of the moisture which provides a deposition inhibiting environment adjacent the moisture adsorbing silicon compounds. Initially, the silicon oxide surface, for example, is catalytically inactive because of the adsorbed moisture. The adsorbed moisture is chemically reacted away by one or more gaseous silicon species formed during the deposition process on exposed silicon by dissociative adsorption. Thus, adsorbed moisture must be maintained or replenished to retain selectivity. This theory applies for low pressure chemical vapor deposition. Although this theory is present, the present invention should not be limited to this theory of operation. The invention is the recognition of the presence of moisture as a deposition inhibiting factor.

A hot wall deposition furnace 10 is illustrated in FIG. 1 as including a glass tube 12 having a door 14. A three zone temperature control 16 activates and control the temperature of the resistant heaters 18. A gas control system 20 provides flow of gas into the tube 12. A pressure system including a vacuum pump and associated valving is provided. A boat 24 having a plurality of wafers 26 is shown in the tube 12. The exact structure of the deposition furnace 10 is not described in detail since it does not play a part of the present invention and may be any commercially available low pressure chemical vapor deposition system.

VLSI technology with higher density, and smaller dimension devices require lower resistant interconnects and planarization of vias, barriers against silicon diffusion into aluminum, low contact resistance etc. Tungsten is considered an ideal material as the low resistant interconnects as well as the barrier against silicon diffusion into aluminum. Thus, the selective deposition of tungsten on single crystalline and deposited silicon and not on thermally grown silicon compounds like silicon dioxide, deposited silicon oxide (doped and undoped) and silicon nitride is considered a preferred process. It is also noted that chemical vapor deposition provides a near perfect conformal step coverage and better adherance of metal to silicon. Although the present invention will discuss the selective deposition of tungsten on an exposed silicon substrate, it should be noted that the present invention is applicable to other semiconductor substrates requiring selectivity as well as other refractory metals for example, molybdenum.

As illustrated in FIG. 2, a substrate 26 preferably silicon has formed thereon a moisture adsorbing mask 28 which is preferably a silicon compound for example, thermally grown or deposited silicon oxide or silicon nitride. The moisture adsorbing mask 28 has an opening 30 thereon exposing a portion of the substrate 26. A layer of metal 32 for example, tungsten, has been selectively deposited in the opening 30 on the exposed substrate 26 and not on the moisture adsorbing mask 28. The process is carried out by inserting the wafer 26 in the diffusion furnace tube 12. The moisture content of the moisture adsorbing mask 28 is assured by heating the deposition tube not higher than the range of 250°–400° C., typically at 290° C. The tube is evacuated and then is backfilled with a moist atmosphere preferably air with 50–100% humidity or other carrier gases for example, nitrogen with the equivalent amount of water. The tube is again evacuated and the tungsten deposition process is allowed to proceed.

The chemical vapor deposition process for a five inch tube includes the introduction of tungsten hexafluoride at 20 SSCM's with a reactant hydrogen gas flow of 1600 SCCM. Preferably, the pressure of the tube is 0.3 Torrs. The flow rate of the tungsten hexafluoride can be in the range of 5–60 SCCM while the hydrogen flow rate must be kept at at least 1000 SCCM. Although the typical temperature is 290° C., lower temperatures down to 250° C. do not affect selectivity but does reduce the deposition rate. Temperatures between 300°–400° C. affect the selectivity and, thus, are not preferred. The variation in the pressure may be between 0.2–0.5 Torr. For the just described parameters, tungsten films of 0.7 ohms per square with high selectivity can be achieved in 40–50 minutes having a thickness of 1200 to 1500 Angstroms. In order to deposit tungsten films of greater thickness, the moisture adsorbing mask 28 must be replenished or recharged with moisture to maintain the selectivity. This process is a repeat of the back filling and moisture introduction previously described.

The thickness of the moisture adsorbing mask 28 may be for example, in the range of 50 to 20,000 Angstroms. Silicon compounds having a greater degree of moisture absorption are preferred. In decending order of moisture adsorbing capability, are chemically vapor deposited silicon oxide, silicon nitride and thermally grown silicon oxide. The oxides may be doped or undoped oxides and all of them fall in a class of glasses.

The wafer is generally prepared to maximize the selective deposition process by removing excessive native oxide growth. This process generally requires the use of hydrogen fluoride which leave residual fluorine on the surface. This residual fluorine has an adverse affect on selectivity and is removed using $NH_4OH$. Typically, the wafer is dipped in a 5% solution of $NH_4OH$. Since $NH_4OH$ also etches silicon, care must be exercised in this treatment.

Maintaining of sufficient gas flow is important since the reduction of the tungsten hexafluoride produces fluorine which will etch the exposed silicon surface. This etching produces biproducts which may deposit on the silicon compound mask and therefore reduce its selectivity. By maintaining a sufficiently high gas flow, the fluorine is swept away from the silicon surface and, thus, etching is minimized.

Although tungsten hexafluoride is described as the preferred gas of tungsten for a chemical vapor deposition, other tungsten halogen gases may be used.

Since it is well known that tungsten hexafluoride will react with bare silicon to cause the reduction of tungsten hexafluoride and the deposition of tungsten, the amount of silicon exposed during the chemical vapor deposition process in order to assure selectivity must be minimized. Thus, it is recommended that the amount of bare silicon exposed on the wafer should be only that where tungsten deposition is desired. In the stack configuration wherein a plurality of wafers are provided in a single furnace as illustrated in FIG. 1, the backside of the silicon wafer, where selective deposition should not take place, should be covered with a mask layer to prevent the exposure of the adjacent front surface of the adjacent wafers from being adversely affected by the exposed silicon.

To illustrate the effect of exposed silicon on the selectivity as well as indicating an alternate source of moisture to create a deposition inhibiting barrier, the experiment of FIG. 3 was conducted. A pair of four inch wafers 26 and 36 were provided on a boat 24 with a three inch wafer 34 therebetween. The wafer 26 has a mask 28 thereon patterned to expose openings 30 therein for the selective deposition of tungsten. The other four inch wafer 36 is bare silicon. The three inch wafer 34 is covered by a water adsorbing layer 35 for example, a silicon compound. The layer 35 is laden with moisture. A typical example of separation between the wafers is 3/16. Using the selective deposition technique described above, it was found that the bare silicon of the four inch wafer 36 prevented selective deposition onto the areas not juxtaposed the moisture bearing wafer 35. This is specifically illustrated in FIG. 4 wherein the tungsten material 32 is provided along the top and outer edges of 26 with selectivity only in the silicon exposed region of the juxtaposed position of the three inch wafer 34 is shown. The presence of the moisture in the center three inch wafer 35 provided a sufficient deposition inhibiting environment adjacent to the surface of the wafer 26 which was not affected by the bare silicon of the four inch wafer 36.

The prior art has had difficulty in beginning the chemical vapor deposition of for example, tungsten, in a cleaned tube. In view of the present invention wherein the moisture is a source of an environment which prevents deposition, a process for preparing a washed tube for selective deposition is provided. The tube after cleaning may be baked at a high temperature to remove substantially all of the moisture. To assure selectivity and control of the selective process, all the moisture should be removed and tungsten deposition begun before the selectivity process. This is achieved by placing a bare substrate of silicon in the tube after the prebaking process. The prebaking is over 700° C. generally and at 800° C. for about one or two hours to remove 90–95% of the moisture. A gas of tungsten hexafluoride is introduced and the temperature is lowered and maintained until tungsten begins to form by reaction with the silicon on the silicon as well as on the walls of the tube. Once the tube walls are coated with tungsten, they no longer adsorb moisture and, thus, do not provide an environment which adversely affects the selectivity. The silicon substrate is then removed and the prepared masked silicon substrates are introduced. The selective chemical vapor deposition processes described above is then carried out. In addition to the bare silicon substrate which is preferred, a silicon substrate precoated with tungsten can also be used as a source for initiation of the chemical vapor deposition of tungsten on the walls of the furnace in combination with a reactant gas like hydrogen for example.

From the preceding description of the preferred embodiments, it is evident that the objects of the invention are attained, and although the invention has been described and illustrated in detail, it is to be clearly understood that the same is by way of illustration and example only and is not to be taken by way of limitation. The spirit and scope of the invention are to be limited only by the terms of the appended claims.

What is claimed is:

1. A method of applying a tungsten layer to selected portions of a substrate comprising:
    applying moisture to at least first surface areas of said substrate which comprise moisture adsorbing material where tungsten is not desired such that said moisture is adsorbed by said moisture adsorbing material of said first surface areas for the purpose of preventing tungsten deposition on said first surface areas; and
    disposing said substrate in a vapor deposition environment containing a tungsten gas such that tungsten metal is deposited on said selected portions of said substrate not having adsorbed moisture thereon.

2. The method according to claim 1 wherein said selected portions one comprised of silicon and said first surface areas are comprised of glass materials.

3. The method according to claim 2 wherein said glass materials comprise silicon oxides.

4. The method according to claim 2 wherein said glass materials comprise silicon nitrides.

5. The method according to claim 1 wherein said substrate is removed from said vapor deposition environment periodically, prior to complete release of moisture from said first surface areas, and moisture is reapplied to said first surface areas such that moisture is again adsorbed thereby.

6. The method according to claim 1 wherein said vapor deposition environment comprises tungsten hexafluoride and hydrogen gas flows.

7. The method according to claim 6 wherein said tungsten hexafluoride gas flow rate is between 5 and 60 SCCM and hydrogen gas flow rate is about 1000 SCCM.

8. The method according to claim 6 wherein said vapor deposition environment temperature is less than 300° C. and the pressure is between 0.2 and 0.5 Torr.

9. The method according to claim 1 wherein the surface of said substrate is subject first to a hydrofluoric pretreatment to remove native oxide growth and then to an ammonium hydroxide dip to remove residual fluorine.

10. The method according to claim 1 wherein said moisture is applied to said substrate by disposing said substrate in an evacuated chamber and back filling with an atmosphere of more than 50% humidity and in a temperature range between 250° and 400° C.

11. A method of selectively applying tungsten to a substrate having silicon and glass surface areas wherein tungsten is selectively deposited over said silicon surface areas but not over said glass areas comprising:
    applying water to said glass surface areas such that the water is adsorbed thereby;
    applying tungsten to said substrate by vapor deposition from a gas flow containing a tungsten gas until said adsorbed water is about to be depleted from said glass surfaces;
    reapplying water to said glass surfaces such that the water is adsorbed thereby; and
    continuing to apply tungsten to said substrate by vapor deposition from a gas flow containing tungsten gas as along as said reapplied and adsorbed water is present in said glass surfaces.

12. A method of selective deposition of tungsten on a substrate by vapor deposition techniques comprising:
    applying moisture to areas of said substrate where tungsten deposition is not desired, such that water is adsorbed by said areas and released during said vapor deposition techniques;
    disposing said substrate in a vapor deposition environment containing a tungsten gas such that tungsten deposition results on said substrate where water is not being released; and maintaining the water content of at least a portion of said areas throughout said vapor deposition of tungsten on said substrate.

13. A method of chemical vapor deposition onto a substrate containing silicon and glass film surface areas, comprising:
applying moisture to said substrate such that water is adsorbed by said glass film surface area; and
applying a tungsten gas to said substrate during chemical vapor deposition as long as water is present in said glass film surface areas, said tungsten gas reacting with said silicon surface area to apply a tungsten metal layer thereto and not reacting with said glass film surface area to not apply a tungsten metal layer thereto.

14. A method of selective deposition of a first material capable of being selectively chemically vapor deposited onto a moisture free surface by exposing to a chemical vapor deposition environment a substrate having a layer of water adsorbent material with openings exposing a second material through said openings comprising:
applying moisture to said water absorbent material to be adsorbed therein;
heating said substrate in a gas flow of said first material in a deposition furnace to deposit said first material on said exposed second material and not on said water adsorbent material; and
terminating said gas flow before said water is depleted from said water adsorbent material.

15. The method according to claim 14 including removing all non-adsorbed water prior to gas flow of said first material.

16. The method according to claim 14 including interrupting said gas flow before said water is depleted from said water adsorbent material, reapplying water to said water adsorbent material and restarting said gas flow of said first material.

17. The method according to claim 16 wherein reapplying water includes subjecting said substrate to a humid atmosphere in said deposition furnace, evacuating said furnace of said humid atmosphere before restarting said gas flow.

18. The method according to claim 14 wherein said gas flow of said first material is sufficiently high to prevent etching.

19. The method according to claim 14 including applying said water adsorbent material and forming the openings in said layer of water adsorbent material of said substrate to minimize the amount of second material exposed.

20. The method according to claim 14 wherein said second material is silicon and said first material is tungsten.

21. The method according to claim 20 wherein said gas of said first material is tungsten hexaflouride and a reducing gas.

22. The method according to claim 20 wherein said water adsorbing material is a silicon compound.

23. The method according to claim 14 further comprising including a plurality of said substrates in said furnace and forming a coating on one side of said substrates to minimize the amount of substrate that is exposed.

24. The method according to claim 14 wherein said furnace is heated in the range of 250° to 400° C.

25. A method of selective deposition of a first material capable of being selectively chemically vapor deposited onto a moisture free surface by exposing to a chemical vapor deposition environment a substrate having a layer of water adsorbent material with openings exposing a second material through said openings comprising:
positioning a localized source of water adjacent said substrate in a deposition furnace;
heating said furnace to cause said localized source of water to produce a deposition inhibiting barrier at the surface of said water adsorbent material;
flowing a gas of said first material in said furnace to deposit said first material on said exposed second material and not on said water adsorbent material; and
terminating said gas flow before said localized source of water is depleted.

26. The method according to claim 25 wherein said gas includes a first material gas and a reduction gas.

27. The method according to claim 26 wherein said deposition inhibiting barrier is produced by said heat and reduction of said gases.

28. The method according to claim 25 wherein said furnace is heated below 300° C.

29. A method of preparing a washed tube for selective chemical vapor deposition of a first material capable of being selectively chemically vapor deposited onto a moisture free surface by exposing a substrate having an exposed portion of a second material to a vapor deposition environment comprising:
placing a quantity of said second material in said tube;
heating said tube;
flowing a gas of said first material in said heated tube to react with said second material and coat the interior of said tube;
terminating said gas flow;
removing the remaining portion of said quantity of said second material;
inserting said substrate; and
beginning said selective chemical vapor deposition process of said first material.

30. The method according to claim 29 wherein said tube is heated in the range of 250°–400° C.

31. The method according to claim 30 including preheating said tube at over 700° C. for an extended period of time and removing the atmosphere prior to placing said quantity of said second material in said tube.

* * * * *